United States Patent [19]

Berger et al.

[11] Patent Number: 4,517,267

[45] Date of Patent: May 14, 1985

[54] PROCESSING MACHINE FOR PRINTING

[75] Inventors: Charles Berger, Ben Lomond; Kenneth Ruth, Davenport, both of Calif.

[73] Assignee: Archival Color Technologies, San Francisco, Calif.

[21] Appl. No.: 457,639

[22] Filed: Jan. 13, 1983

[51] Int. Cl.³ .......................... G03H 3/00; G03C 5/24
[52] U.S. Cl. ..................................... 430/3; 430/401; 430/403; 430/434; 134/1; 354/328
[58] Field of Search .................. 430/3, 403, 401, 434, 430/264; 134/1; 354/328

[56] References Cited

U.S. PATENT DOCUMENTS

| | | | |
|---|---|---|---|
| 890,379 | 6/1908 | Sherrick | 354/328 |
| 2,626,858 | 1/1953 | McGraw et al. | 430/390 |
| 2,945,760 | 7/1960 | Ostergaard | 430/401 |
| 3,849,135 | 11/1974 | Karlikowski | 430/3 |
| 4,239,387 | 12/1980 | Ahrens | 354/315 |
| 4,423,945 | 1/1984 | Preston et al. | 354/328 |

FOREIGN PATENT DOCUMENTS

| | | | |
|---|---|---|---|
| 2304102 | 11/1976 | France | 354/328 |
| 2075372 | 11/1981 | United Kingdom | 430/3 |

OTHER PUBLICATIONS

Dighton, et al., "Ultrasonic Agitation of Photographic or Radiographic Developer", Journal of the Society for Non-Destructive Testing, Jan.–Feb. 1958, pp. 40-41.

Primary Examiner—Mary F. Downey
Attorney, Agent, or Firm—Flehr, Hohbach, Test, Albritton & Herbert

[57] ABSTRACT

An apparatus and method of use thereof is provided for use in pigment printing wherein the apparatus provides for regulated and repeatable results in the development of colored photographic pigmented gelatin images.

1 Claim, 6 Drawing Figures

PROCESSING MACHINE FOR PRINTING

The present invention is directed to an apparatus and method of use thereof in a process of printing color photographs using pigmented gelatin materials commonly known as carbon tissues. More particularly, the present invention is directed to an apparatus and method of use thereof whereby unhardened gelatin may be effectively separated from a sheet of hardened gelatin to provide a photographic image of predictable and repeatable density.

In conventional methods of producing color photographic prints and transparencies, the color image is formed by the presence of light fugitive organic dyes. The photographic processes associated with the use of such dyes allow rapid, facile processing of the prints but suffer from the disadvantage of a relatively rapid fade and deterioration associated with the use of light fugitive dyes. While, for many applications, the lifetime of a conventional color print is sufficient, i.e., usually around two to five years, without undue exposure to heat, light or extreme cold, there remains a need for a more permanent color photograph. Such more permanent color photographs, for example, may be utilized in portraiture, fine art work, commercial displays, or any purpose for which the owner may wish to retain for a substantially long period of time, such as, fifty years or more, the photographs original color balance, density and luminosity. The carbon pigment process has long been known to utilize light stable pigments as the colorants to produce colored images. See, for example, U.S. Pat. No. 2,626,858 to McGraw et al. However, the carbon pigment process is a time-consuming hand printing process since it requires multiple development and transfer of three colored pigmented gelatin images. The color is provided by lightfast color pigments which are not chemically developed to colored matter, but which must be formed into colored images and transferred intact onto supports. In the case of a colored picture, three of such pigmented images must be transferred onto a single support sheet in precise registration in order to obtain a clear and true colored image. Another problem with the carbon pigment process is the difficulty of obtaining predictable and repeatable development of the pigmented gelatin images. The pigmented gelatin in several steps of the process requires agitation of a support sheet in water to dissolve the relatively soft undeveloped gelatin. The degree of agitation and method of agitation was critical because if the agitation was not sufficient, the undeveloped gelatin would not be completely removed and would tend to produce dark and seemingly overexposed pictures. On the other hand, if agitation was too vigorous, the pigmented image would be overwashed and highlights which should contain the most delicate details would be unclear. Thus, it is difficult to achieve consistent and repeatable results owing to the variables of hand development. It is therefore an object of the present invention to provide a method and apparatus for use in a pigment process whereby the problem of separating the unhardened gelatin has been significantly improved, thereby achieving consistent and repeatable results in the density of a developed pigmented gelatin image.

These and other objects of the invention will become apparent by the following description and appended claims.

The process of printing color carbon pigment photographs as ordinarily performed may be described as follows. First, three color separation negatives are produced from a color photograph, each negative representing the subject as seen by a light of a particular wavelength region, usually red, green and blue.

Exposure

Next, each of these color separation negatives is mated with a sensitized carbon tissue of appropriate color and exposed to a highly actinic light source, such as mercury vapor lamps or black light tubes. Thus, for example, the blue filter separation negative is contacted with a yellow carbon tissue coated on a paper base. The red separation negative is mated with the cyan printer and the green filter separation negative is mated with the magenta printer. One way of sensitizing the pigmented tissue is by soaking in a suitable container of aqueous solution and drying. When carbon tissue is brought into contact with the emulsion of the negative and exposed to a light source, a chemical action occurs which forms a latent image of hardened pigmented gelatin extending inward from the surface of the pigmented gelatin. The negative sheet is removed.

Assembly

The exposed pigment sheet is wetted, placed on an assembly support and squeegeed together.

Development

The sandwich is placed in hot water and the pigment backing sheet is peeled away. The image is developed in hot water with sufficient agitation to melt and remove the soft gelatin, leaving the hardened pigment gelatin adhering to the surface of the assembly support paper. This procedure is repeated for each colored pigmented gelatin image.

Transfer To Temporary Support

After drying the three developed color images are then transferred onto a temporary support sheet consisting of a piece of paper or transparency coated with soft gelatin. The transfer may be accomplished by soaking the assembly support and temporary support in cold water and contacting time with one another face to face with squeegeeing and then drying. As the temporary support dries, the colored image clings to the soft gelatin and is pulled away from the assembly support layer. The temporary support containing the three color image may now be coated by an appropriate preservative and used as is or may be further transferred to a final support.

As set forth in the above description it is seen that there are a plurality of developing steps performed by agitated washing that are critical to the final colors and density of the printed photograph. This is further complicated by the problem, that there is no definite end point to the hot-water development when hand developed. Such variations caused by an individual worker's habits, techniques, and skills will effect the degree and evenness of color development.

Figure 1:
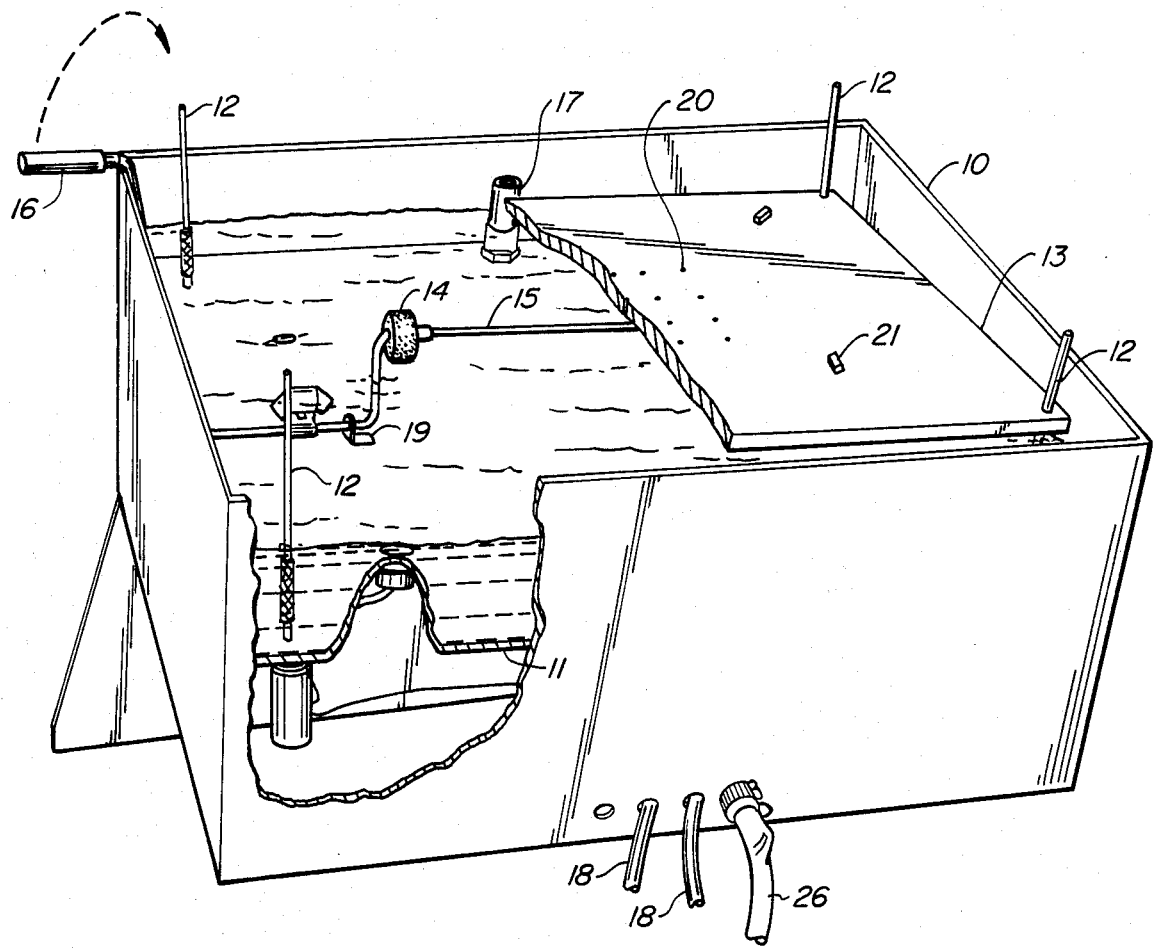
FIG. 1 is a perspective of a preferred embodiment of the apparatus according to the present invention.

According to the present invention, improvements in the repeatability and predictability of results may be accomplished by the preferred apparatus shown in FIG. 1. Referring to FIG. 1, there is shown developing container 10 partially filled with an aqueous solution used for developing pigment prints. The floor 11 of container 10 accommodates vertically extending rods 12 which serve as guides for raising and lowering plate 13 into the liquid. Plate 13 is supported by rollers 14 located on elevating arm 15. As shown in FIG. 1, elevating arm 15 is in the vertical position wherein plate 13 is raised out of the aqueous liquid. Elevating arm 15 may be lowered to the horizontal position by handle 16, whereby plate 13 is lowered into the liquid. The liquid level within container is maintained by overflow drain 17. The temperature of the liquid is controlled by heating and temperature control means (not shown) whereby water is pumped into and out of container 10 via pipes 18. The elevator arm 15 is held rigidly in place by brackets 19 affixed to floor plate 11. A plurality of perforations 20 located approximately centrally on plate 13 are provided so that vacuum pressure may be applied on the underside of plate 13 by an aspirator or other vacuum producing means (not shown), whereby the sheets used in the pigment process may be held flatly in place on plate 13. Tabs 21 are located on the upper surface of plate 13 to provide guides for at least two edges of sheets used in the pigment printing process.

Figure 2:
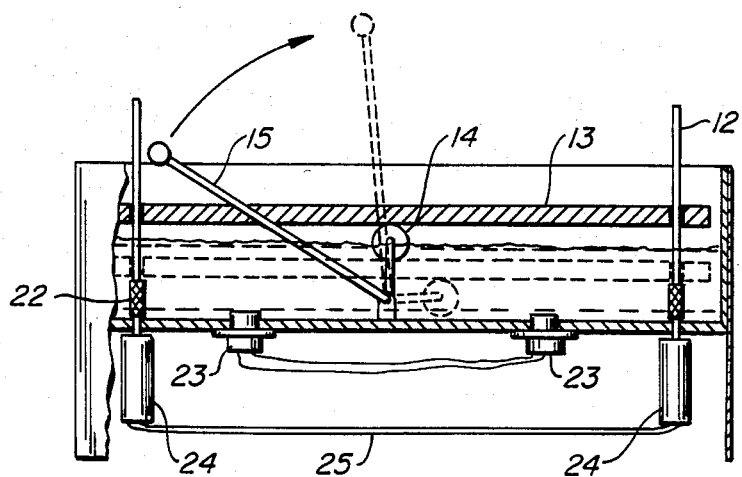
FIG. 2 is a partial cutaway of elevation of the apparatus of FIG. 1.
Figure 3:
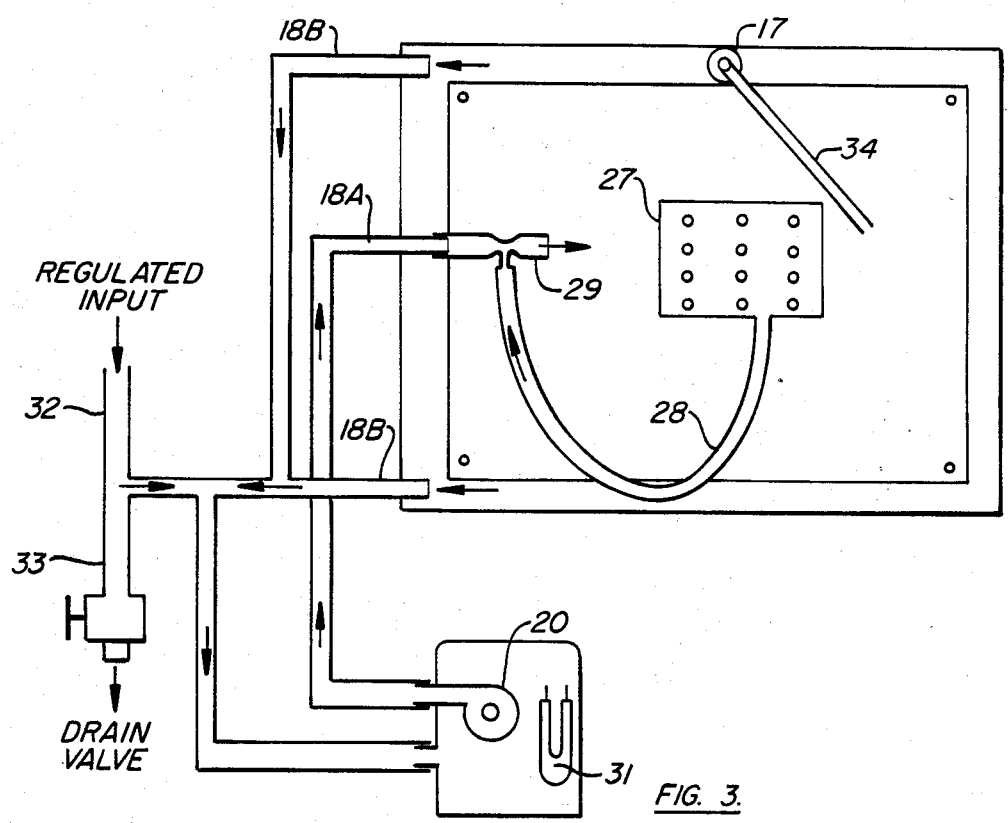
FIG. 3 is a schematic illustration of the heating and water control means used in connection with the apparatus of FIG. 1.

Referring to FIG. 2, there is shown the method of operation of elevator arm 15. When in the lowered position plate 13 is supported by roller 14 and additionally by sleeves 22 concentrically located on each of rods 12. The base plate 11 of container 10 is provided with ultrasonic transducers 23 which impart ultrasonic vibration into the volume of liquid. Also, the bottom end of each of rods 12 is affixed to a motor 24 which produces vibrational motion to rod 12 which, in turn, induces vibration of plate 13. The motors 24 are interconnected by a system of lanyards 25 which transmits vibration among motors 24. The electrical wires required to transducers 23 and motors 24 may be grouped and fitted into electrical housing 26 shown in FIG. 1. Referring to FIG. 3, there is shown a schematic plan of an apparatus according to the present invention. Vacuum manifold 27 is shown which is attachable to the underside of plate 13 used for applying a vacuum through perforations 20. Vacuum line 28 may be attached to a conventional aspirator pump 29 or any other conventional vacuum producing means. Water into container 10 is led in by inlet pipe 18a and water exits container 13 by outlet pipe 18b. Water flow is regulated by means of pump 30 and heater 31 which are controllable by conventional temperature and flow regulating electronic means. Water enters into the system by inlet 32 and the whole system may be drained via drain valve 33. Overflow drain 17 and tank 13 is shown connected to drain pipe 34.

Figure 4:
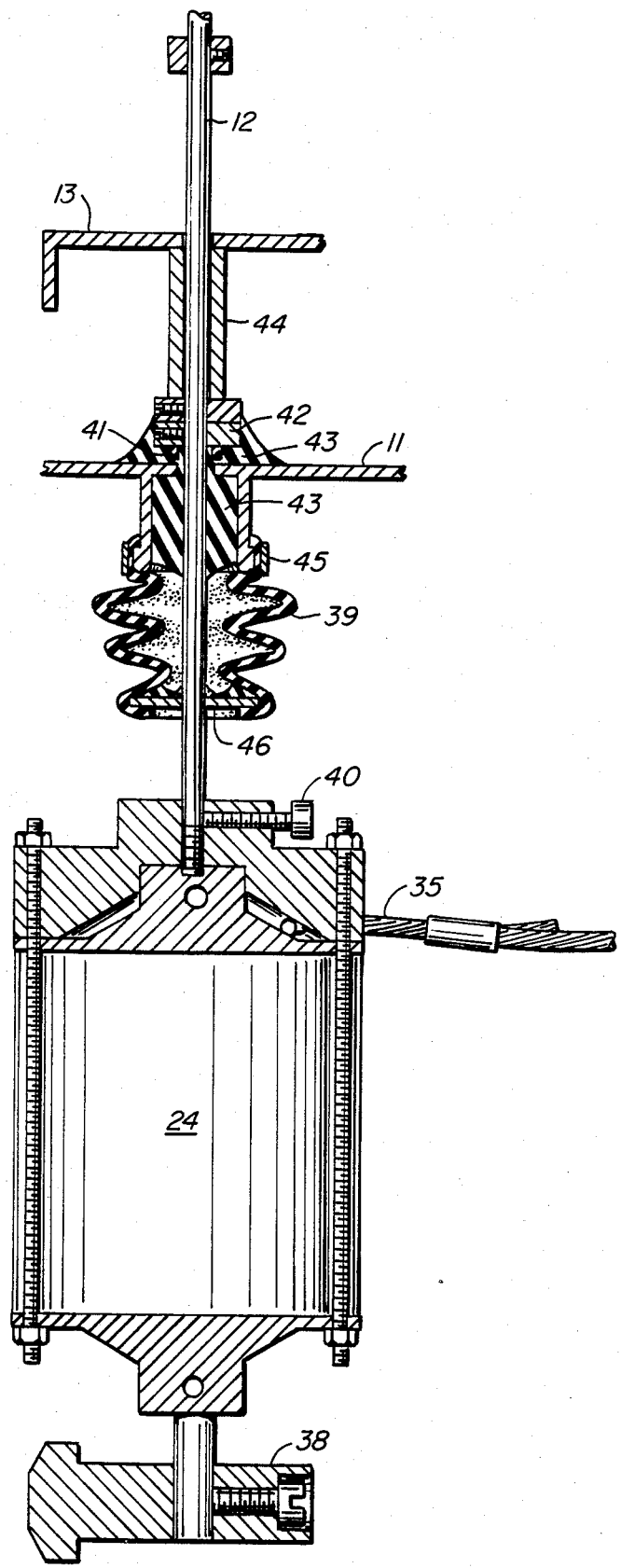
FIG. 4 is a detailed view of an agitation motor assembly.

Referring to FIG. 4, there is shown a detailed elevation of motor 24 and the mode of attachment thereof to base plate 11. Motors 24 are interconnected by lanyards 35. Rod 12 is rigidly affixed to motor 24 by threads and lock screw 40. The hole in plate 11 accommodating rod 12 is of a substantially larger diameter than rod 12. A nylon pivot 41 and thrust bearings 42 are provided to limit the rocking motion of rod 12. Flexible scalant 43, such a silicone, is provided to prevent leakage of liquid. Spacer 44 supports plate 13. Bellows 39 is accommodated by clamp means 45 and disc 46. Vibrational motion is produced by asymmetric flyweight 38 on the motor shaft.

Figure 5A:
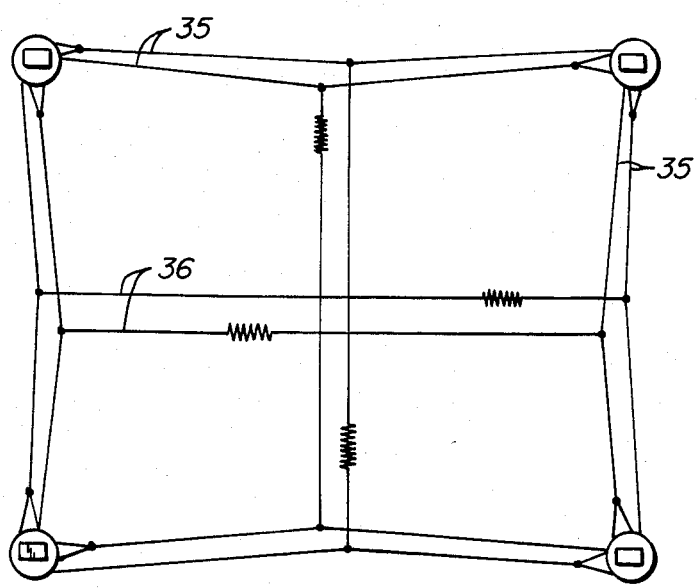
FIGS. 5A and 5B are a bottom view and an elevation, respectively, of the motor and lanyard assembly of the apparatus of FIG. 1.
Figure 5B:
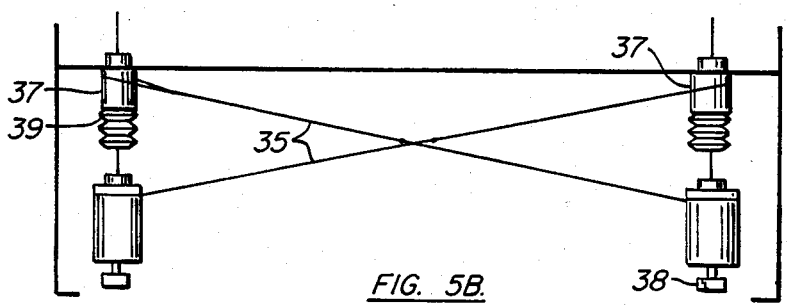

Referring to FIGS. 5A and 5B, there is shown the lanyard system for interconnecting motors 24. Referring to FIG. 5A, there is shown that the motors are directly interconnected by a double series of cables 35. The cables 35 are in turn transversely interconnected to the cables on the opposite side by nylon lanyard tension cords 36. Lanyards 35 are preferably made of stainless steel. Referring to FIG. 5B, there is shown that lanyards 35 interconnecting adjacent motors are across one another, one end being directly attached to the motor and the other end being directly attached to sleeve 37 which accommodates rod 12. The end of each motor 24 is equipped with an asymmetric fly weight 38, the rotation of which causes a vibration of the motor which is in turn imparted to rod 12 connected to the motor and also to adjacent motors via lanyards 35. Bellows 39 are provided to accommodate seals, spacers, clamps and bearings (not shown) utilized to accommodate the free play of rod 12 through its opening in plate 13 while also providing sealing means to prevent leaks of liquid through that opening.

What is claimed is:

1. In a pigment process for producing an image comprising substantially water insoluble pigmented gelatin on a support sheet, the improvement comprising the step of selectively removing soft substantially water soluble gelatin in an aqueous environment in the presence of said image by ultrasonic vibration and mechanical agitation, wherein said mechanical agitation is provided by vibration of a plate accommodating said sheet, said plate being loosely accommodated by a plurality of rods vertically disposed in a container, said rods affixed to motors providing vibratory motion whereby vibrational movement of each of said rods by said motors imparts agitational motion to said plate; and said ultrasonic vibration is provided by ultrasonic frequency transducing means; whereby said ultrasonic vibration and said mechanical agitation are sufficient to cause separation of said soft gelatin from said sheet while retaining said image intact.

* * * * *